(12) United States Patent
Kobayashi (10) Patent No.: US 11,121,240 B2
(45) Date of Patent: Sep. 14, 2021

(54) SEMICONDUCTOR DEVICE

(71) Applicant: FUJI ELECTRIC CO., LTD., Kanagawa (JP)

(72) Inventor: Kunio Kobayashi, Azumino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/285,202

(22) Filed: Feb. 26, 2019

(65) Prior Publication Data

US 2019/0326423 A1 Oct. 24, 2019

(30) Foreign Application Priority Data

Apr. 19, 2018 (JP) .............................. JP2018-080564

(51) Int. Cl.
*H01L 29/739* (2006.01)
*H01L 49/02* (2006.01)
*H01L 29/78* (2006.01)

(52) U.S. Cl.
CPC .......... *H01L 29/7393* (2013.01); *H01L 28/20* (2013.01); *H01L 29/782* (2013.01); *H01L 29/7819* (2013.01)

(58) Field of Classification Search
CPC .................... H01L 29/66681–66704; H01L 29/7816–7826
See application file for complete search history.

(56) References Cited

U.S. PATENT DOCUMENTS

| 2005/0194660 A1 | 9/2005 | Mochizuki | |
|---|---|---|---|
| 2011/0062451 A1* | 3/2011 | Ohno | H01L 27/153 257/79 |
| 2016/0013300 A1* | 1/2016 | Hashimoto | H01L 29/7393 363/131 |

FOREIGN PATENT DOCUMENTS

| JP | H0518127 A | 1/1993 |
|---|---|---|
| JP | H0518127 U | 3/1993 |
| JP | 2003319638 A | 11/2003 |
| JP | 2005228851 A | 8/2005 |

* cited by examiner

*Primary Examiner* — Walter H Swanson (57) ABSTRACT

In a semiconductor device using, as a FWD, a diode formed in a silicon carbide (SiC) substrate, while preventing gate oscillation, an increase of switching loss is suppressed at the time of a temperature increase also. A semiconductor device includes: a transistor element; a diode element formed in a SiC substrate; and a resistive element that is electrically connected to a gate of the transistor element, and has a resistor temperature coefficient which is within the range of $\pm 150 \times 10^{-6}$/K. The resistive element has a resistor formed of a ceramic-containing material.

14 Claims, 12 Drawing Sheets

SEMICONDUCTOR DEVICE

The contents of the following Japanese patent application are incorporated herein by reference:
NO. 2018-080564 filed on Apr. 19, 2018.

BACKGROUND

1. Technical Field

The present invention relates to a semiconductor device.

Semiconductor devices including transistors such as IGBTs (insulated gate bipolar transistors) and diodes such as FWDs (Free Wheeling Diodes) or SBDs (Schottky Barrier Diodes) are widely used. In a known method for preventing the gate oscillation phenomenon that occurs at the gate of a transistor in a semiconductor device, a resistive element is externally attached to the gate (please see Patent Literature 1, for example). However, an increase of resistance of the resistive element connected to the gate leads to an increase of switching loss of the semiconductor device.

CITATION LIST

Patent Literature

[Patent Literature 1] Japanese Patent Application Publication No. 2005-228851

In a semiconductor device using, as a FWD, a diode formed in a silicon carbide (SiC) substrate, it is preferred to suppress an increase of switching loss at the time of a temperature increase also.

SUMMARY

A first aspect of the present invention provides a semiconductor device. The semiconductor device may include a transistor element. The semiconductor device may include a diode element. The diode element may be formed in a SiC substrate. The semiconductor device may include a resistive element. The resistive element may be electrically connected to a gate of the transistor element. The resistive element may have a resistor temperature coefficient which is within the range of $\pm 150 \times 10^{-6}$/K.

The resistive element may be a ceramic resistive element. The ceramic resistive element may have at least one resistor formed of a ceramic-containing material.

The transistor element, the diode element formed in the SiC substrate and the ceramic resistive element may be placed on a placement surface of a circuit board. The ceramic resistive element may have a first electrode. The first electrode may be placed on the placement surface of the circuit board. The ceramic resistive element may include at least one second electrode. The second electrode may be arranged on a side opposite to the circuit board and be arranged to face the first electrode. The resistor may be provided between the first electrode and the second electrode. The resistor may be electrically connected between the first electrode and the second electrode.

Between the first electrode and the second electrode, a ceramic insulator may be provided around the resistor.

A thickness of the ceramic insulator may be greater between the resistor and the first electrode than between the resistor and the second electrode.

A thickness of the second electrode may be greater than a thickness of the first electrode.

An outline of the first electrode as seen from a perpendicular direction to a bottom surface of the first electrode may include a rounded corner.

A depression may be provided in the placement surface of the circuit board. The ceramic resistive element may be placed in the depression.

The at least one resistor may at least include a first resistor, and a second resistor and a third resistor. The second resistor and the third resistor may be arranged to sandwich the first resistor. The first resistor, the second resistor and the third resistor may be arranged such that parts of the first resistor, the second resistor and the third resistor in a longitudinal direction face each other. One end of the first resistor may be electrically connected to an end portion that is among end portions of the second resistor and is adjacent to the one end of the first resistor. The other end of the first resistor that is opposite to the one end of the first resistor may be electrically connected to an end portion that is among end portions of the third resistor and is adjacent to the other end of the first resistor. The first resistor, the second resistor and the third resistor may be electrically connected to each other in series.

The first resistor, the second resistor and the third resistor may be arranged along a surface parallel with the first electrode.

Above the first electrode, the first resistor, the second resistor and the third resistor may be stacked one on another in an upward direction from the first electrode and with a ceramic insulator being superimposed therebetween. Electrical connection may be established between the first resistor and the second resistor through a via provided in the ceramic insulator. Electrical connection may be established between the first resistor and the third resistor through a via provided in the ceramic insulator.

The at least one resistor may include a plurality of resistors. The at least one second electrode may include a plurality of second electrodes. The plurality of second electrodes may be separated from each other so as to be electrically connected to gates of individual transistors among a plurality of transistors. The plurality of resistors may be electrically connected to the one common first electrode. The plurality of resistors may be electrically connected to the plurality of second electrodes, respectively.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
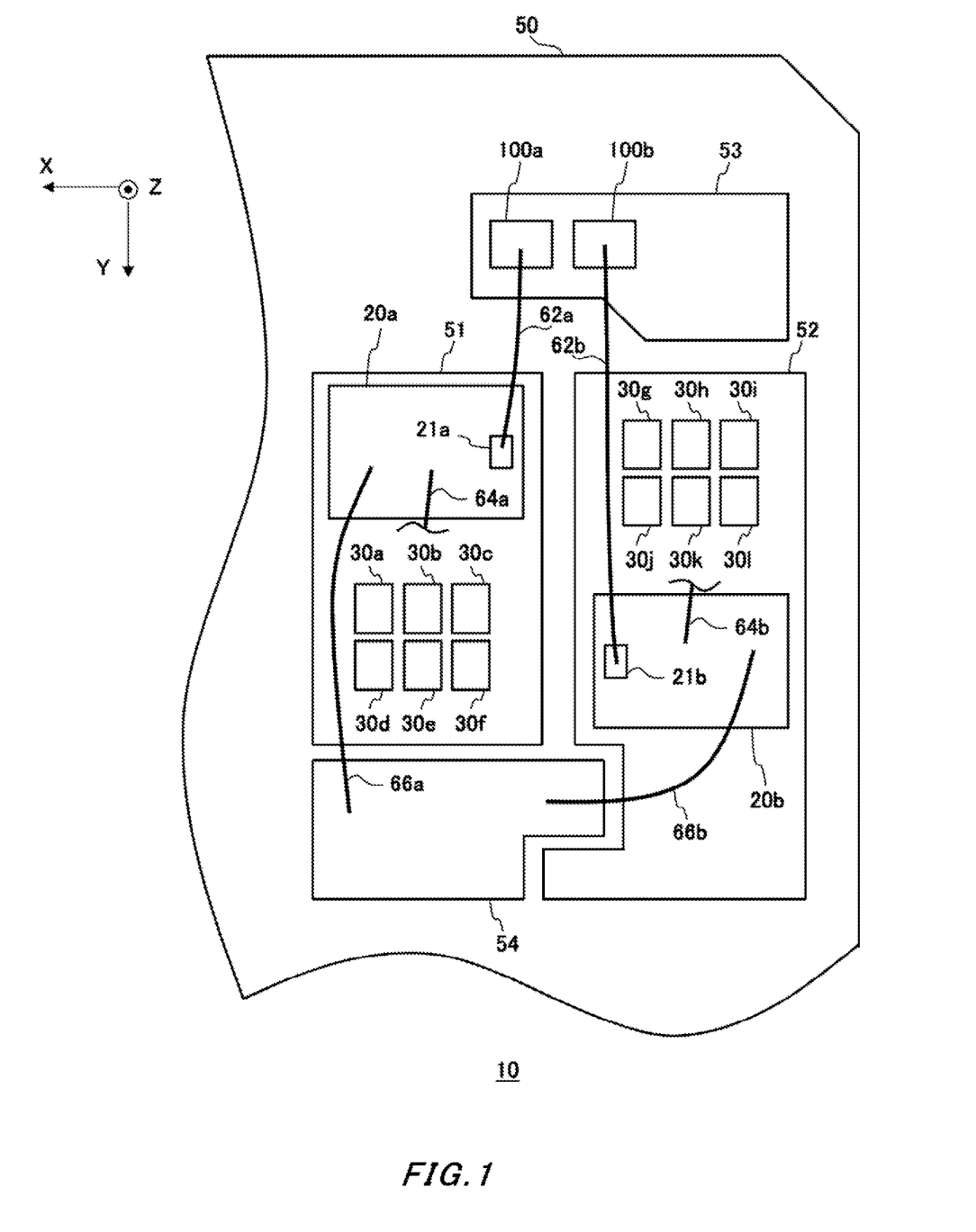
FIG. 1 is a figure showing the schematic configuration of a semiconductor device 10 in one embodiment of the present invention.

FIG. 1 is a figure showing the schematic configuration of a semiconductor device 10 in one embodiment of the present invention. FIG. 1 schematically shows selected parts from the configuration of the semiconductor device 10. The semiconductor device 10 is a semiconductor module. The semiconductor device 10 includes transistor elements 20a, 20b (referred to as a transistor element 20 in some cases), and diode elements 30a to 30l (referred to as a diode element 30 in some cases). The transistor element 20 is a transistor element 20 formed in a Si substrate. The transistor element 20 may be an IGBT.

In the present example, the diode element 30 is a diode element 30 formed in a SiC substrate. The diode element 30 may be an SBD (referred to as a SiC-SBD) formed in a SiC substrate. In the present example, the plurality of diode elements 30a to 30f are connected in parallel. In addition, the plurality of diode elements 30g to 30l are connected in parallel. Note that the semiconductor device 10 is not limited to this configuration.

As mentioned above, the semiconductor device 10 is a hybrid module in which the transistor element 20 and the diode element 30 are formed in different types of semiconductor substrate. In particular, the semiconductor device 10 may be an IGBT hybrid module on which a SiC-SBD is mounted.

The semiconductor device 10 includes at least one gate resistive element 100a, 100b (referred to as a gate resistive element 100 in some cases). The gate resistive elements 100a, 100b are resistive elements electrically connected to the gates of the transistor elements 20a, 20b, respectively. The gate resistive elements 100a, 100b are provided outside chips of the transistor elements 20a, 20b. In the present example, a gate pad 21a of the transistor element 20a and the front surface of the gate resistive element 100a are electrically connected by a wire 62a. A gate pad 21b of the transistor element 20b and the front surface of the gate resistive element 100b are electrically connected by a wire 62b. The wires 62a, 62b may be formed of a conductive material.

The semiconductor device 10 may include a circuit board 50. The circuit board 50 may be a laminated substrate in which the front surface and rear surface of an insulating layer are provided with metal layers. In particular, a metal layer provided on the front surface of the circuit board 50 may include circuit layers 51, 52, 53, 54 to provide circuit patterns. In the present example, the circuit layers 51, 52, 53 provide placement surfaces of the circuit board 50, and the transistor element 20, diode element 30 and gate resistive element 100 are placed on the placement surfaces of the circuit board 50.

In the present example, the transistor element 20a, and the diode elements 30a to 30f connected to the transistor element 20a are placed on the circuit layer 51. The collector of the transistor element 20a and the cathode of each of the diode elements 30a to 30f may be electrically connected by the circuit layer 51. The transistor element 20b, and the diode elements 30g to 30l connected to the transistor element 20b are placed on the circuit layer 52. The collector of the transistor element 20b and the cathode of each of the diode elements 30g to 30l may be electrically connected by the circuit layer 52.

If there are a plurality of transistor elements 20a, 20b, the gate resistive elements 100a, 100b may be connected to the gate pads 21a, 21b of the plurality of transistor elements 20a, 20b, respectively. The gate resistive element 100a connected to the gate pad 21a of the transistor element 20a and the gate resistive element 100b connected to the gate pad 21b of the other transistor element 20b may be placed on a single circuit layer 53. The plurality of gate resistive elements 100a, 100b may be provided adjacently.

The emitter of the transistor element 20a and the anode of each of the diode elements 30a to 30f may be electrically connected by a wire 64a. Likewise, the emitter of the transistor element 20b and the anode of each of the diode elements 30g to 30l may be connected by a wire 64b. The emitter of each of the transistor element 20a and transistor element 20b, and the circuit layer 54 may be electrically connected through wires 66a, 66b, respectively. Note that the arrangement and number of each element in the semiconductor device 10 are not limited to those shown in FIG. 1.

Figure 2:
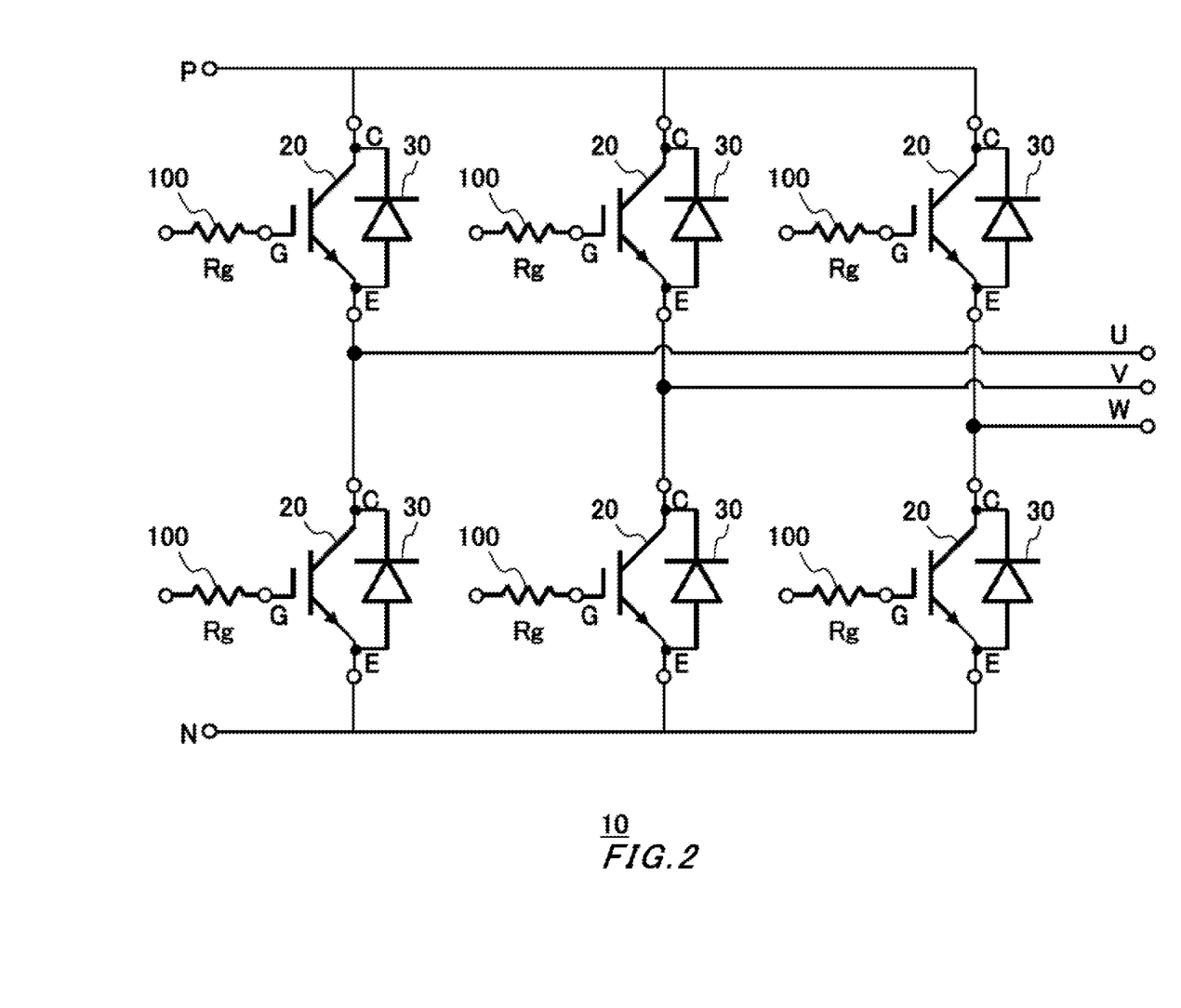
FIG. 2 is a figure showing an exemplary circuit configuration of the semiconductor device 10.

FIG. 2 is a figure showing an exemplary circuit configuration of the semiconductor device 10. FIG. 2 shows an example of an inverter circuit. The semiconductor device 10 may include at least one pair of configurations, each configuration including a transistor element 20 and a diode element 30 to function as a FWD that are connected in antiparallel. Although FIG. 2 includes six pairs of transistor elements 20 and diode elements 30, all the six pairs may not be included in one semiconductor device 10. One or two pairs of a transistor element(s) 20 and a diode element(s) 30 may be included.

Among the six pairs of the transistor elements 20 and diode elements 30, three pairs each constitute an upper arm circuit, and the remaining three pairs each constitute a lower arm circuit. In the present example, a connection point at which the collectors of the transistor elements 20 in the upper arm circuit are connected corresponds to a direct current positive voltage terminal P. A connection point at which the emitters of the transistors in the lower arm circuit are connected corresponds to a direct current negative voltage terminal N. Each connection point between one upper arm circuit and one lower arm circuit corresponds to a three-phase alternating current circuit output terminal, U terminal, V terminal or W terminal. Note that the circuit configuration of the semiconductor device 10 is not limited to an inverter circuit.

If, unlike the semiconductor device 10 of the present embodiment, the semiconductor device is a silicon module circuit in which a transistor such as an IGBT and a diode such as a FWD are both formed in a Si substrate, the internal resistance of the circuit has a negative or zero resistor temperature coefficient (resistor temperature dependence).

Accordingly, along with a temperature increase, the internal resistance decreases, and still more current flows in some cases. As a result, current imbalances occur in some cases due to current crowding at some transistor elements 20 among a plurality of transistor elements 20 that are connected in parallel. In order to prevent this current imbalance, in a configuration adopted, resistive elements having relatively large positive resistor temperature coefficients are used as gate resistors. This is because, by arranging such a gate resistor near each transistor element 20, the gate resistance increases, and current crowding at some transistor elements 20 can be prevented. In one example, a Si resistive element that exhibits a positive resistor temperature coefficient which is approximately $7000 \times 10^{-6}$/K is used as a gate resistor. The resistor temperature coefficient is a rate of change of resistance per 1 K (kelvin), and is an average rate of change of resistance in the temperature range of 25° C. to 125° C. here. For example, if the resistance of a Si resistive chip at 25° C. is 10Ω, the Si resistive chip at 125° C. has a resistance of 20Ω. If a ceramic resistive element showing a small resistor temperature coefficient which is $\pm 150 \times 10^{-6}$/K is used as a gate resistor in a silicon module circuit, the gate oscillation phenomenon can be suppressed, but current crowding at some transistor elements 20, and a resulting current imbalance used to occur in some cases.

On the other hand, if, as in the present example, the semiconductor device 10 is an IGBT hybrid module circuit on which a SiC-SBD is mounted, the resistor temperature coefficient of the internal resistance of the circuit itself becomes positive. In this case, since the internal resistance of the circuit increases along with a temperature increase, the drawback of current crowding at some circuits is suppressed by the circuit itself. That is, current imbalances due to current crowding at some transistor elements 20 among a plurality of transistor elements 20 that are connected in parallel never occur. Accordingly, it is not required to connect a resistive element having a relatively large positive resistor temperature coefficient to the gate of the transistor element 20.

The switching speed of the semiconductor device 10 lowers as the resistance of the gate resistive element 100 increases. Accordingly, the switching loss of the semiconductor device 10 increases. In particular, if a Si resistive chip is used as a gate resistive element, the value of the gate resistive element increases as temperature of the semiconductor device 10 increases, thereby increasing the switching loss.

In the present embodiment, while an IGBT hybrid module on which a SiC-SBD is mounted is adopted as the semiconductor device 10, the gate resistive element 100 having a resistor temperature coefficient within the range of $\pm 150 \times 10^{-6}$/K is used. Accordingly, a drawback of current crowding at some circuits along with a temperature increase is solved by adopting an IGBT hybrid module on which a SiC-SBD is mounted, and additionally an increase of electrical resistance of the gate resistive element 100 at the time of a temperature increase can be suppressed to suppress an increase of switching loss.

The gate oscillation phenomenon occurs due to parasitic capacitance and transfer characteristics of an IGBT and a FWD, external inductance or the like. Suppression of the gate oscillation phenomenon requires shifting the resonance point to a region outside actual operating conditions. If the resonance point is shifted by lowering the saturation current value, performance of the IGBT deteriorates. In order to shift the resonance point to a region outside the actual operating conditions without lowering the saturation current value, it is conceivable to connect a gate resistor to the outside of the IGBT chip. In a resonance circuit, a resistor exhibits the function of damping resonance.

Figure 3:
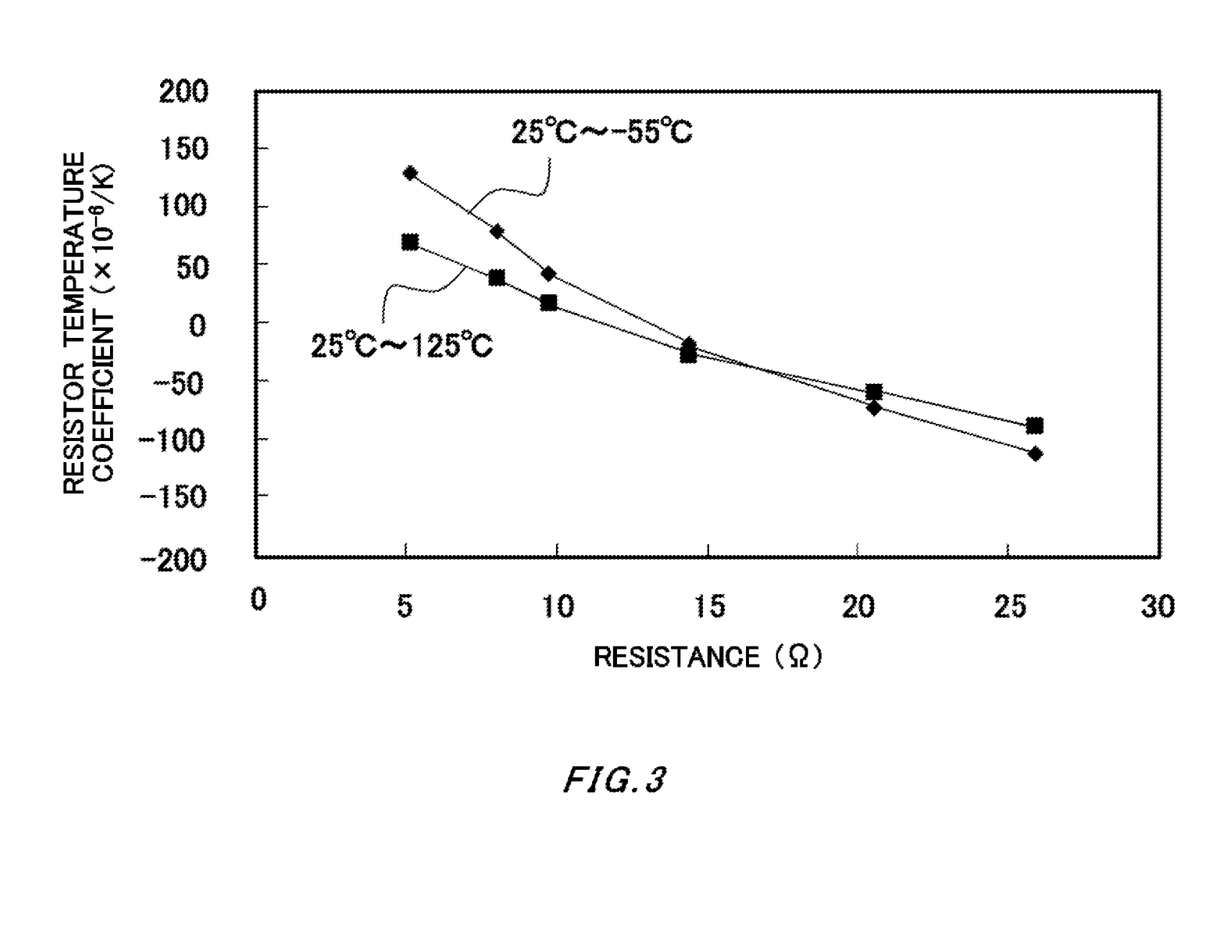
FIG. 3 is a figure showing an exemplary resistor temperature coefficient of a ceramic resistive element used as a gate resistive element 100 of the semiconductor device 10.

FIG. 3 is a figure showing an exemplary relationship between the resistance at 25° C. and resistor temperature coefficient of a ceramic resistive element used as a gate resistive element 100 of the semiconductor device 10. In FIG. 3, in addition to the resistor temperature coefficient in a high-temperature region from 25° C. to 125° C., the resistor temperature coefficient in a low-temperature region from −55° C. to 25° C. is also shown. In ceramic resistive elements with the same structure, the resistor temperature coefficient increases as the resistance decreases, and the resistor temperature coefficient decreases as the resistance increases. The value of the gate resistive element 100 may be 5 Ω to 50 Ω inclusive, and may be 5 Ω to 10 Ω inclusive, depending on the specifications. Even if a gate resistive element 100 with a resistance of 30 Ω to 50Ω inclusive is used, the resistor temperature coefficient of the gate resistive element 100 shown in FIG. 3 satisfies the range of $-150 \times 10^{-6}$/K to $+150 \times 10^{-6}$/K inclusive. If a gate resistive element 100 with a resistance of 5 Ω to 10 Ω inclusive is used, the resistor temperature coefficient of the gate resistive element 100 may be within the range of $-150 \times 10^{-6}$/K to $+150 \times 10^{-6}$/K inclusive. For example, if a ceramic resistive element is used, the Si resistive chip has a resistance of approximately 10.15 Ω at 125° C. when the resistance of the ceramic resistive element is 10 Ω at 25° C.

In particular, in an IGBT hybrid module in which a SiC-SBD is mounted, gate oscillation easily occurs in a low-temperature region equal to or lower than 25° C. Accordingly, a gate resistive element 100 having a resistance that can prevent gate oscillation in a low-temperature region is used. Note that a gate resistive element 100 having a negative resistor temperature coefficient may be used so that the resistance decreases as temperature increases.

Figure 4:
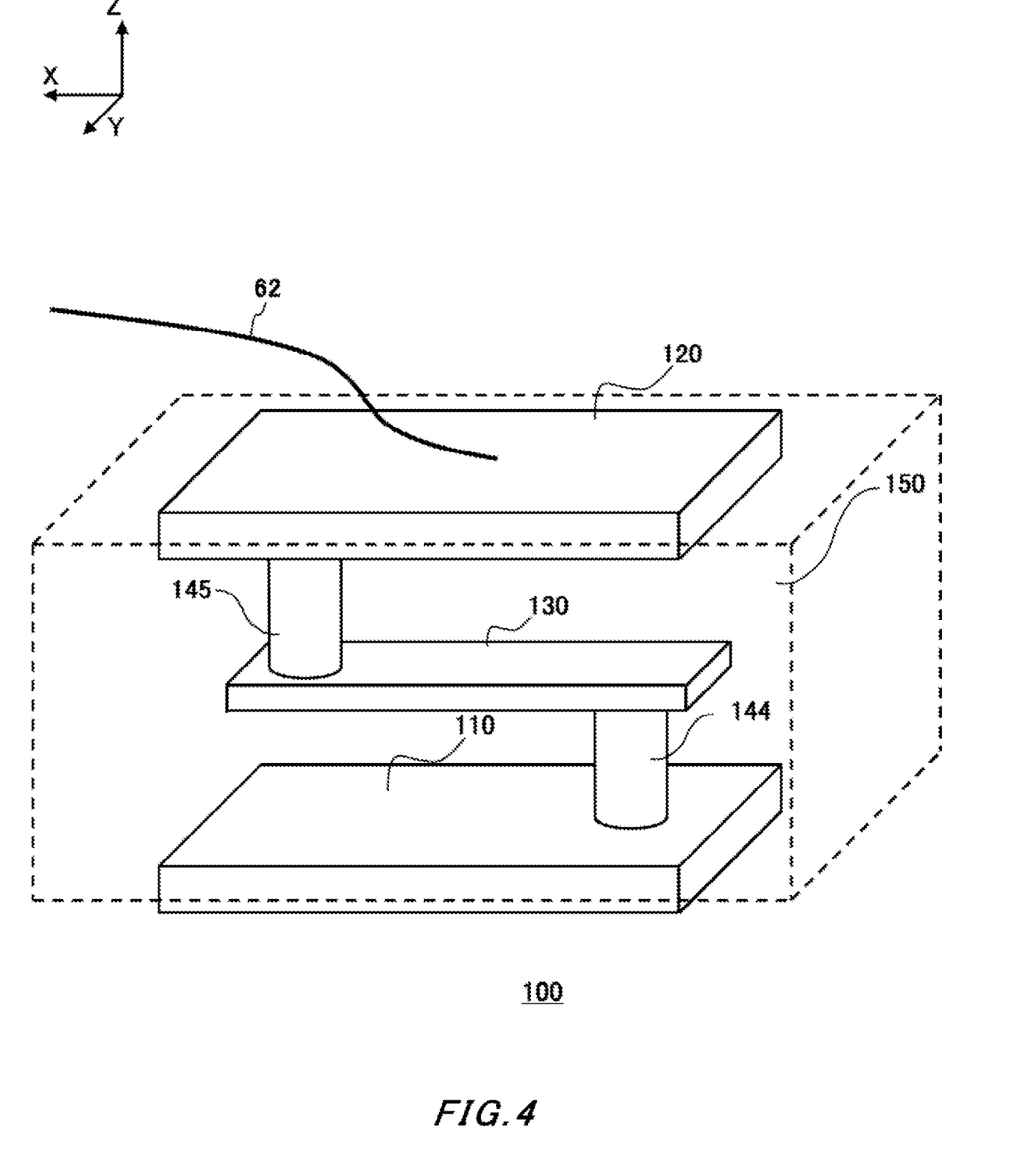
FIG. 4 is a figure showing the schematic configuration of the gate resistive element 100.

FIG. 4 is a figure showing the schematic configuration of the gate resistive element 100. The gate resistive element 100 includes a first electrode 110, a second electrode 120 and a resistor 130. The first electrode 110 is placed on a placement surface (X-Y plane) of the circuit board 50. The second electrode 120 is arranged on the side opposite to the circuit board 50 and is arranged to face the first electrode 110. The first electrode 110 and the second electrode 120 are spaced apart in the Z-axis direction.

The first electrode 110 and second electrode 120 may be formed of a conductive material such as metal. For example, the first electrode 110 and second electrode 120 are formed of silver (Ag). Note that the first electrode 110 and second electrode 120 may contain a glass component such that they have improved bonding property or for other purposes. The first electrode 110 and second electrode 120 may have plated layers formed at their surfaces. The plated layers may have bases made of nickel (Ni) and surfaces made of gold (Au). The thicknesses of the first electrode 110 and the second electrode 120 may be 10 μm to 50 μm inclusive, and for example is 20 μm.

The second electrode 120 may be electrically connected with the gate of the transistor element 20 by the wire 62. The wire 62 may be bonded to the top surface of the second electrode 120. A surface of each member on the side closer to the circuit board 50 is referred to as the bottom surface, and a surface thereof opposite to the bottom surface is referred to as the top surface.

The resistor 130 is provided between the first electrode 110 and the second electrode 120. In the present example, the resistor 130 is provided between the first electrode 110 and the second electrode 120 in the Z-axis direction. The resistor 130 is electrically connected between the first electrode 110 and the second electrode 120. For example, one end of the resistor 130 electrically contacts a conductive via 144; on the other hand, the other end of the resistor 130 electrically contacts a conductive via 145. The conductive via 144 is electrically connected to the first electrode 110. The conductive via 145 is electrically connected to the second electrode 120.

The resistor 130 is formed of a ceramic-containing material. The gate resistive element 100 is a ceramic resistive element having the resistor 130 formed of a ceramic-containing material. The resistor 130 is formed of an oxide such as a ruthenium oxide ($RuO_2$) or a $RuO_2$-glass composite, for example. The resistor 130 may contain an alloy such as a silver-palladium alloy, a chromium-silicon alloy, or a nickel-chromium alloy. The conductive vias 144, 145 may be formed of a conductive material such as silver.

By forming the resistor 130 with a ceramic-containing material such that the resistor temperature coefficient of the resistor 130 is within the range of $\pm 150 \times 10^{-6}$/K inclusive, an increase of resistance of the gate resistive element 100 is suppressed even if temperature increases. Accordingly, even if temperature increases, an increase of switching loss is suppressed. Note that the gate resistive element 100 only has to have a resistor temperature coefficient within the range of $\pm 150 \times 10^{-6}$/K inclusive, and it is not limited to a ceramic resistive element.

Between the first electrode 110 and the second electrode 120, the ceramic insulator 150 is provided around the resistor 130. The ceramic insulator 150 is a substrate of a ceramic resistive element. The ceramic insulator 150 is formed of a ceramic material such as alumina or a glass-alumina composite, for example. The thermal conductivity of the ceramic insulator 150 may be equal to or lower than 20 W/mK. If the thermal conductivity of the substrate of the ceramic resistive element is lower than Si in this manner, the ceramic resistive element does not easily transfer heat as compared to a Si resistive chip. Accordingly, since heat generated in the transistor element 20 such as an IGBT is less easily transferred to the resistor 130, the influence of temperature can be reduced.

Figure 5:
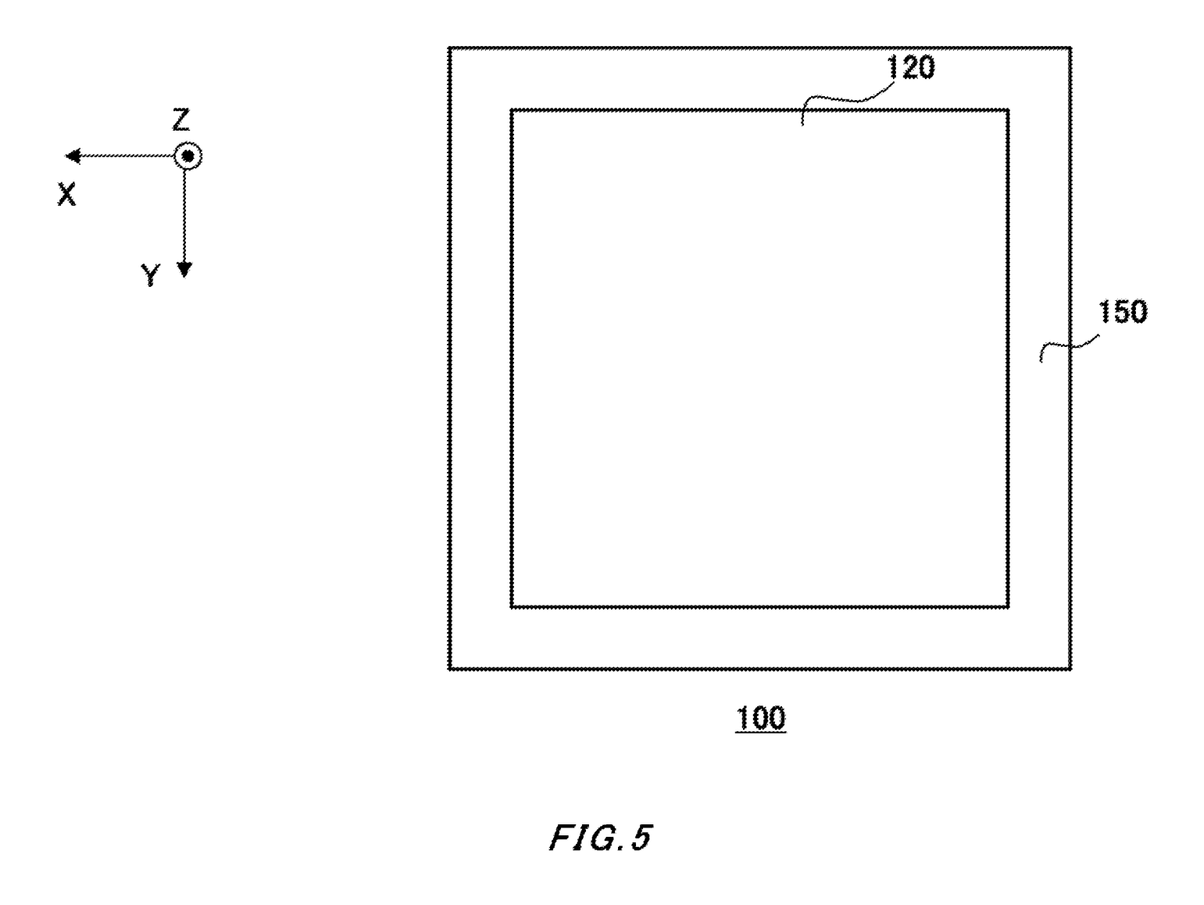
FIG. 5 is a top view of an exemplary gate resistive element 100.
Figure 6:
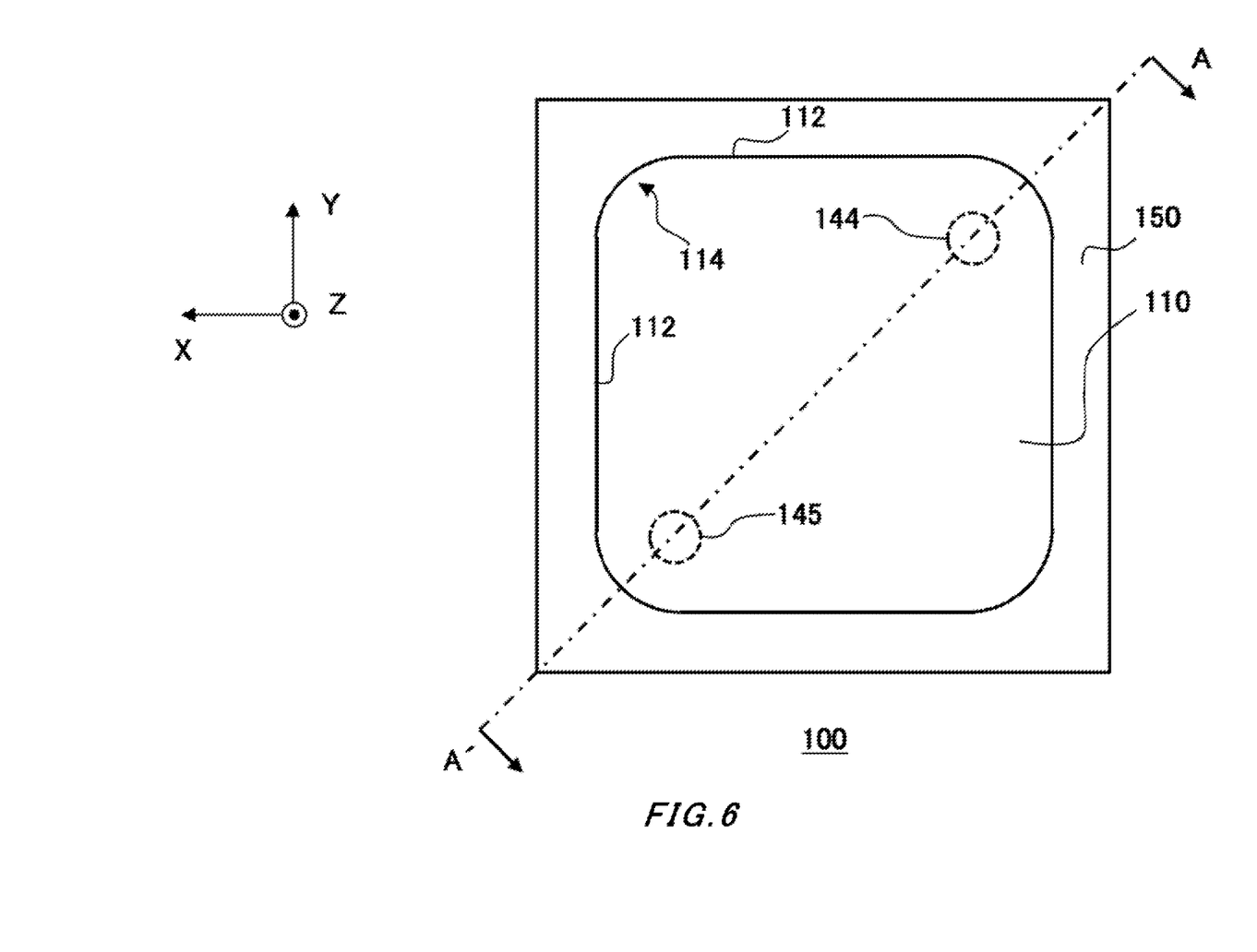
FIG. 6 is a bottom view of an exemplary gate resistive element 100.

FIG. 5 is a top view of an exemplary gate resistive element 100. FIG. 6 is a bottom view of an exemplary gate resistive element 100. As shown in FIG. 6, the outline of the first electrode 110 as seen from a perpendicular direction to the bottom surface of the first electrode 110 includes a plurality of straight line portions 112 and corners 114 linking adjacent straight line portions 112 smoothly. In the present example, the outline of the first electrode 110 includes four straight line portions 112 and four corners 114. The corners 114 may be rounded. In other words, the corners 114 may be curved lines having shapes protruding toward the outer edge of the gate resistive element 100. On the other hand, as shown in FIG. 5, the outline of the first electrode 110 as seen from a perpendicular direction to the top surface of the second electrode 120 may not have rounded corners. Thereby, it becomes easy to distinguish between the rear surface and front surface of the gate resistive element 100.

The first electrode 110 is solder-bonded to a circuit layer which is the placement surface of the circuit board. In solder-bonding, stresses concentrate at the corners of the first electrode 110. Accordingly, due to a configuration in which each corner 114 of the first electrode is rounded, stresses are relaxed. Thereby, it is possible to prevent damages to the gate resistive element 100 and the solder layer beforehand. In addition, as shown in FIG. 6, the conductive via 145 and conductive via 144 may be provided at positions closer to the corners 114 than to the center of the first electrode 110.

Figure 7:
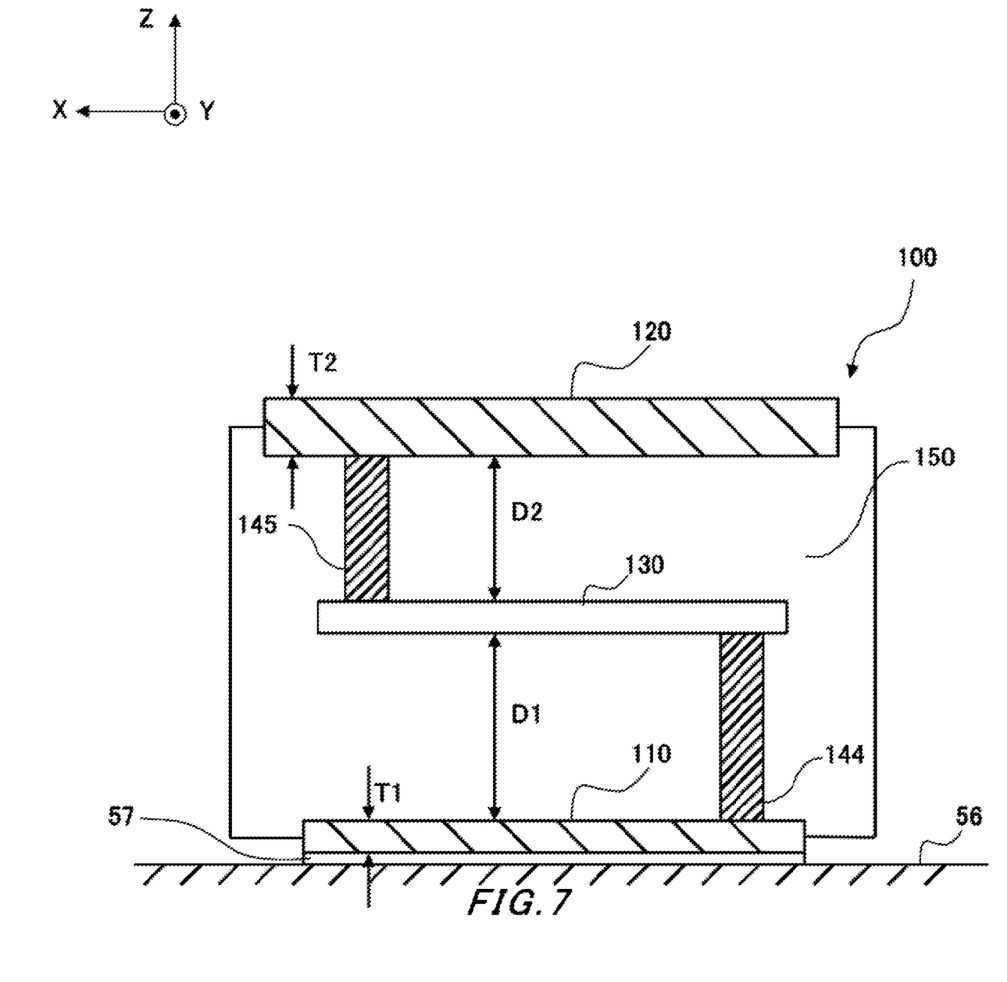
FIG. 7 is a sectional view of an exemplary gate resistive element 100.

FIG. 7 is a sectional view of an exemplary gate resistive element 100. FIG. 7 is a sectional view taken along the line A-A' in FIG. 6. The gate resistive element 100 may be bonded onto a placement surface 56 of the circuit board 50 with a solder layer 57 being interposed therebetween. The thickness D1 of the ceramic insulator 150 between the resistor 130 and the first electrode 110 is greater than the thickness D2 of the ceramic insulator 150 between the resistor 130 and the second electrode 120. By making the thickness D1 greater than the thickness D2, heat generated at the transistor element 20 such as an IGBT is less easily transferred to the resistor 130. Thereby, the influence of temperature on the resistance of the resistor 130 can be reduced.

As shown in FIG. 7, the thickness T2 of the second electrode 120 is greater than the thickness T1 of the first electrode 110. The second electrode 120 contains a glass component for an improved strength of bonding with the ceramic insulator 150, which is the substrate of the ceramic resistive element. By making the thickness T2 of the second electrode 120 greater than T1, the total amount of the glass component contained in the second electrode 120 increases, and accordingly the bonding strength between the second electrode 120 and the ceramic insulator 150 increases. Accordingly, the second electrode 120 that is likely to receive forces because the wire 62 and the like are bonded thereto can have reinforced bonding properties.

The gate resistive element 100 of the present example may be 1-mm square to 5-mm square inclusive. For example, the gate resistive element 100 is 2-mm square. Then, the first electrode 110 is arranged on the bottom surface side of the gate resistive element 100, and the second electrode 120 is arranged on its top surface. Accordingly, it becomes easier to perform solder-bonding between the first electrode 110 and the circuit board 50, and additionally it is easier to perform bonding of the wire 62 onto the top surface of the second electrode 120.

The gate resistive element 100 has a thickness between the bottom surface of the first electrode 110 and the top surface of the second electrode 120 which is greater than the thickness of the chip of the transistor element 20 which is an IGBT and the thickness of the chip of the diode element 30 which is a SiC-SBD. For example, the thickness of the gate resistive element 100 is 500 μm to 800 μm inclusive. Accordingly, it is greater than the thickness of the chip of the diode element 30 which is approximately 300 μm to 400 μm inclusive, and the thickness of the chip the transistor element 20 which is approximately 100 μm to 200 μm inclusive.

When performing solder-bonding, the top surface of each chip of an IGBT, a SiC-SBD and a gate resistive element may be pressed. By using jigs for pressing the top surfaces of individual chips with different lengths depending on the thicknesses of the individual chips, solder-bonding can be performed simultaneously while cancelling out differences among the thicknesses of the individual chips, and not causing an inclination of the individual chips. Note that differences among the thicknesses of the individual chips may be cancelled out by the circuit board 50.

Figure 8:
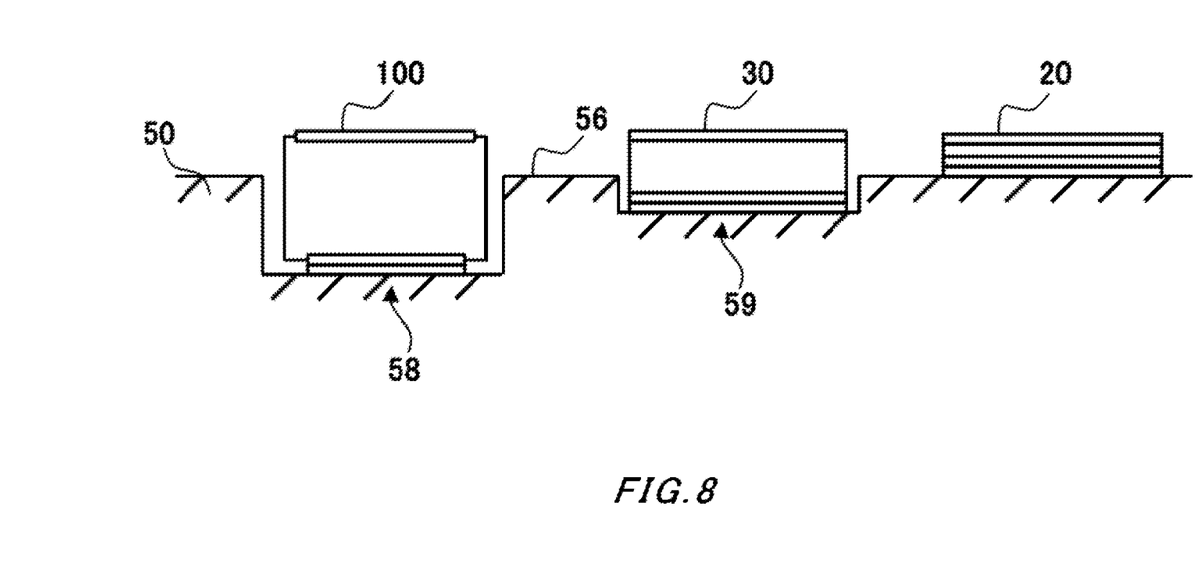
FIG. 8 is a figure showing an exemplary circuit board having a depression.

FIG. 8 is a figure showing an exemplary circuit board having a depression. The circuit board 50 may be provided with a depression 58 and a depression 59 in the placement surface 56 in order to cancel out the differences among the thicknesses of the transistor element 20, diode element 30 and gate resistive element 100. The depression 58 may have a depth greater than the depth of the depression 59. The gate resistive element 100 which is a ceramic resistive element is placed in the depression 58. The chip of the diode element 30 may be placed in the depression 59. The chip of the transistor element 20 may be placed on the placement surface 56 at a location where the depressions are not provided. By providing the depression 58 and depression 59 in the circuit board 50 in this manner also, the positions of the top surfaces of the individual chips can be kept within a predetermined range. Accordingly, solder-bonding can be performed simultaneously without causing an inclination of the individual chips.

Figure 9:
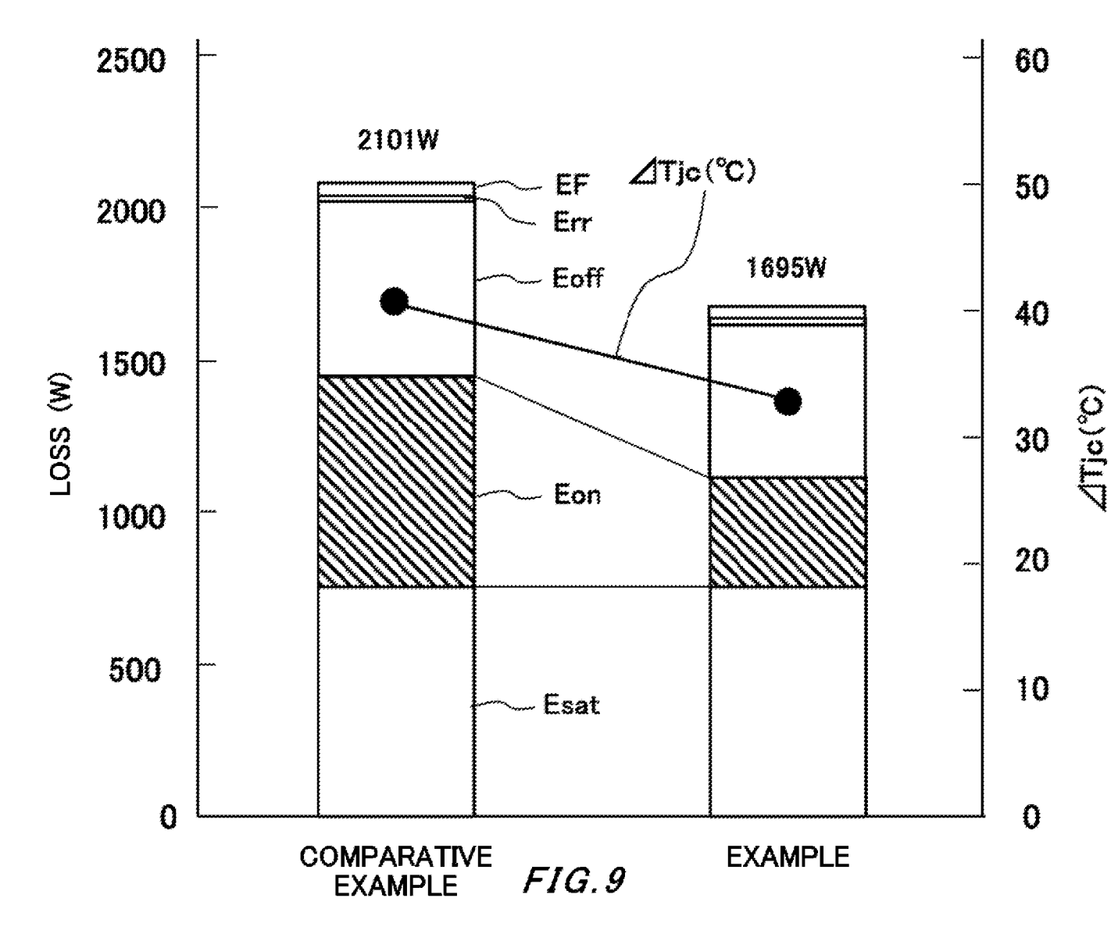
FIG. 9 is a figure showing comparison of losses in the semiconductor device 10 of the present embodiment and a semiconductor device of a comparative example.

FIG. 9 is a figure showing comparison of losses in the semiconductor device 10 of the present embodiment and a semiconductor device of a comparative example at the time of power running. In FIG. 9, the temperature difference ΔTjc between junction temperature and case temperature of the semiconductor device 10 is also displayed.

The semiconductor device 10 of the present embodiment shown in FIG. 9 and the semiconductor device of the comparative example are both hybrid modules on which a SiC-SBD and a Si IGBT are mounted. Note that the semiconductor device 10 of the present embodiment uses, as the gate resistive element 100, a ceramic resistive element having properties shown in FIG. 3. On the other hand, the semiconductor device of the comparative example uses a Si resistive chip as the gate resistive element 100. An inverter device like the one shown in FIG. 2 is configured using the semiconductor device 10 of the present embodiment, and power running was performed. Likewise, an inverter device is configured using the semiconductor device of the comparative example, and power running was performed.

As shown in FIG. 9, loss at the time of power running of the semiconductor device 10 in the present embodiment is 1695 (W), and loss at the time of power running of the semiconductor device in the comparative example is 2101 (W). Accordingly, with the semiconductor device 10 in the present embodiment, loss at the time of power running can be reduced by approximately 20% as compared to a Si IGBT hybrid module in which a resistor formed of a Si semiconductor is used and on which a SiC-SBD is mounted.

Loss in the semiconductor device 10 can be roughly classified into five types of loss, conduction loss (Esat) of the IGBT, turn-on loss (Eon) of the IGBT, turn-off loss (Eoff) of the IGBT, conduction loss (Ef) of the FWD, and reverse-recovery loss (Err) of the FWD. It has been shown that, as compared with the comparative example, the semiconductor device 10 of the present embodiment reduces turn-on loss (Eon) of the IGBT.

Figure 10:
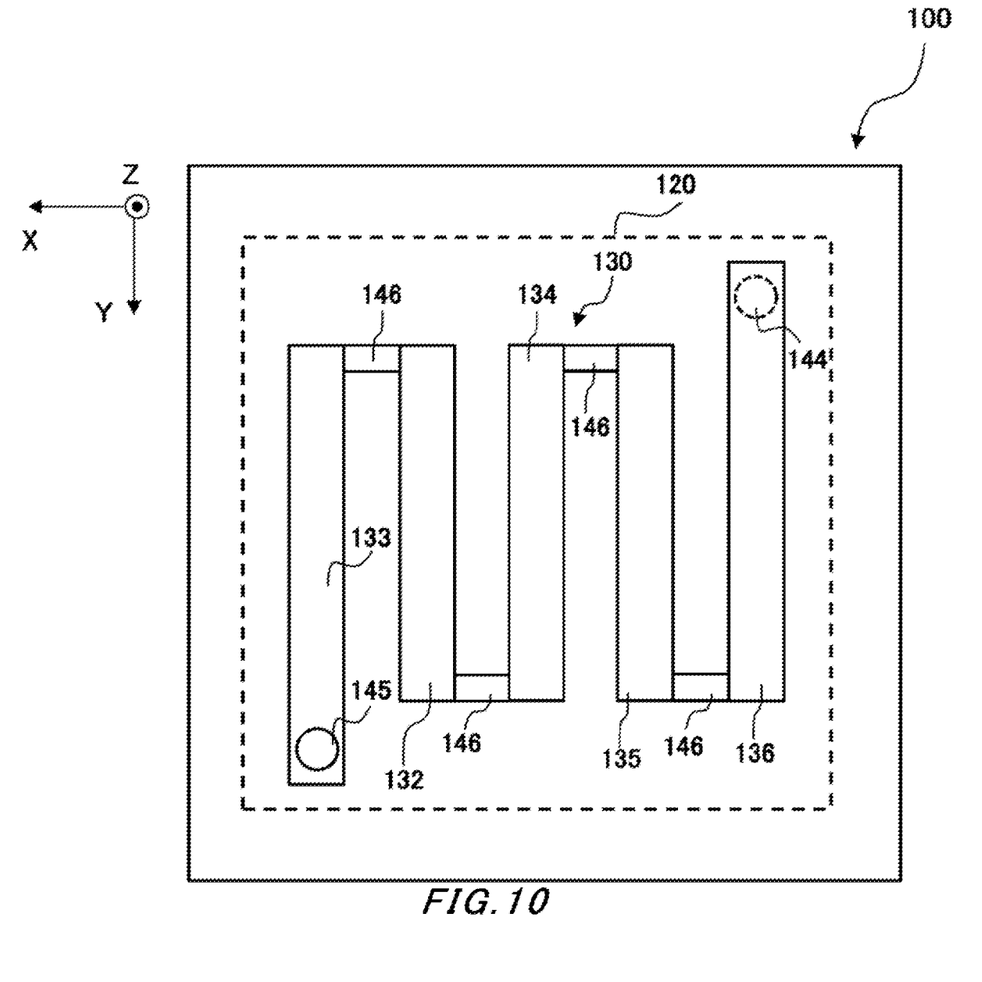
FIG. 10 is a plan view showing a variant of the gate resistive element 100.

FIG. 10 is a plan view showing a variant of the gate resistive element 100. Since, in an actual gate resistive element 100, due to the presence of the second electrode 120 and the ceramic insulator 150, the resistor 130 cannot be seen from the top surface direction. However, in FIG. 10, the structure of the resistor 130 as seen from the top surface direction is shown for convenience of explanation.

In the variant shown in FIG. 10, the resistor 130 at least has a first resistor 132, a second resistor 133 and a third resistor 134. The second resistor 133 and third resistor 134 are arranged to sandwich the first resistor 132. The first resistor 132, second resistor 133 and third resistor 134 are arranged such that parts thereof in the longitudinal direction face each other. In the present example, the first resistor 132, second resistor 133 and third resistor 134 extend in the Y-axis direction, and the Y-axis direction is the longitudinal direction. The first resistor 132, second resistor 133 and third resistor 134 face each other with intervals therebetween in the X-axis direction. In the present example, the first resistor 132, second resistor 133 and third resistor 134 are arranged along a surface (an X-Y plane) parallel with the first electrode 110.

One end of the first resistor 132 (a −Y-axis direction end portion in the present example) is electrically connected to an end portion which is among end portions of the second resistor 133 and is adjacent to the one end of the first resistor 132 by a connecting portion 146. The other end (a +Y-direction end portion in the present example) opposite to the one end of the first resistor 132 is electrically connected to an end portion which is among end portions of the third resistor 134 and is adjacent to the other end of the first resistor 132 by another connecting portion 146.

In the present example, the resistor 130 includes a fourth resistor 135 and a fifth resistor 136. The fourth resistor 135 also is connected with an end portion of the third resistor 134 at its −Y-axis direction end portion by a connecting portion 146, and the fifth resistor 136 also is connected with an end portion of the fourth resistor 135 at its +Y-axis direction end portion by a connecting portion 146. The first resistor 132, second resistor 133 and third resistor 134 at least are electrically connected to each other in series. In the present example, the first resistor 132 to the fifth resistor 136 are electrically connected in series. One end of a group of the resistors that are electrically connected in series may be connected to the conductive via 144, and its other end may be connected to the conductive via 145.

The connecting portions 146 may be formed of a conductive material. For example, the connecting portions 146 are formed of a metal like silver. With the gate resistive element 100 of the variant shown in FIG. 10, the gate resistive element 100 having a resistance which is 20 Ω to 60 Ω inclusive can be realized by a material containing ruthenium oxide ($RuO_2$) and a silver-palladium alloy as in the case where the resistance is approximately 10).

Figure 11:
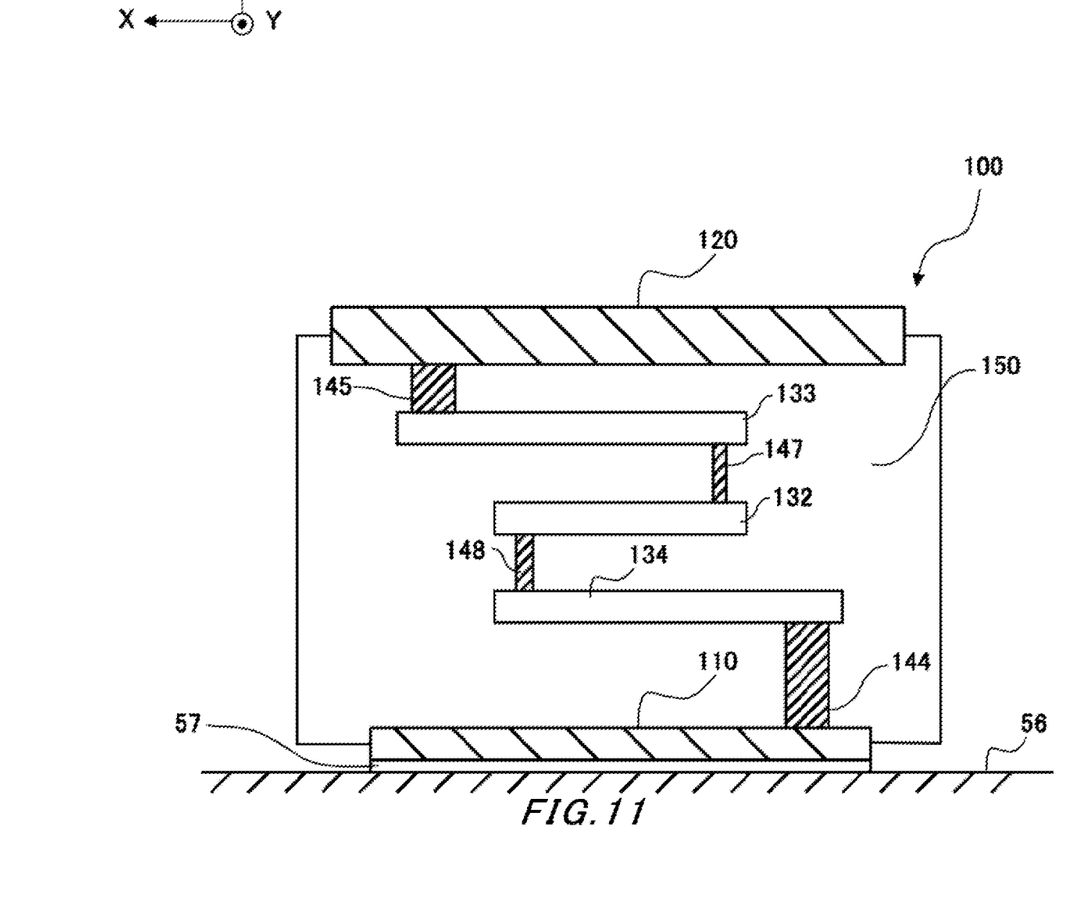
FIG. 11 is a sectional view showing another variant of the gate resistive element 100.

FIG. 11 is a sectional view showing another variant of the gate resistive element 100. In FIG. 10 mentioned above, a plurality of resistors are arranged zigzag along an X-Y plane parallel to the first electrode 110. However, the gate resistive element 100 is not limited to it. As shown in FIG. 11, above the first electrode 110, the first resistor 132, second resistor 133 and third resistor 134 may be stacked one on another in a direction to intersect with the first electrode 110 (in the Z-axis direction which is the upward direction from the first electrode 110) with the ceramic insulator 150 being interposed therebetween.

The first resistor 132 and the second resistor 133 are electrically connected through a via 147 provided in the ceramic insulator 150. The first resistor 132 and the third resistor 134 are electrically connected through a via 148 provided in the ceramic insulator 150. With the variant shown in FIG. 11 also, effects similar to those in the configuration shown in FIG. 10 can be realized. The footprint on an X-Y plane can be reduced.

Figure 12:
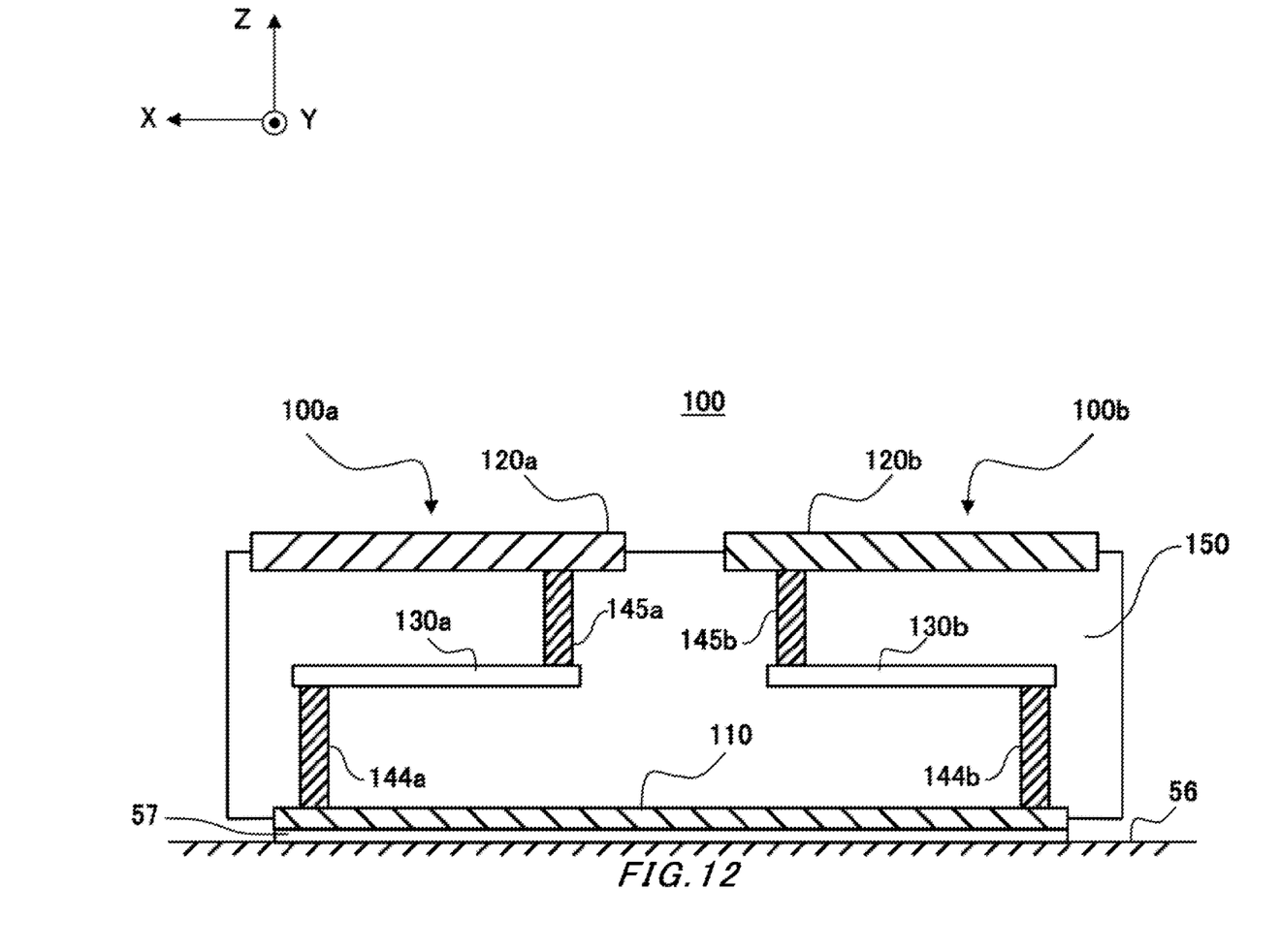
FIG. 12 is a sectional view showing another variant of the gate resistive element 100.

FIG. 12 is a sectional view showing another variant of the gate resistive element 100. In FIG. 12, elements of two gate resistive elements 100*a*, 100*b* are provided in a substrate of one ceramic resistive element.

In the gate resistive element 100 of the present example, at least one resistor includes a plurality of resistors 130*a*, 130*b*. At least one second electrode includes a plurality of second electrodes 120*a*, 120*b*. That is, the gate resistive element 100 of the present example includes the plurality of resistors 130*a*, 130*b*. The gate resistive element 100 includes the plurality of second electrodes 120*a*, 120*b*. The second electrode 120*a* is electrically connected to the gate pad 21 of the transistor element 20a in FIG. 1, for example. The second electrode 120b is electrically connected to the gate pad 21 of the transistor element 20b in FIG. 1, for example. The plurality of second electrodes 120a, 120b are separated from each other so as to be electrically connected to the gates of individual transistor elements among a plurality of transistor elements 20.

One end of each of the plurality of resistors 130a, 130b is electrically connected to the one common first electrode 110. Specifically, one end of the resistor 130a is electrically connected to the first electrode 110 through a conductive via 144a. One end of the resistor 130b is electrically connected to the first electrode 110 through a conductive via 144b.

The other ends of the plurality of resistors 130a, 130b are electrically connected to the second electrodes 120a, 120b, respectively, that are separated from each other. The other end of the resistor 130a is electrically connected to the second electrode 120a through a conductive via 145a. The other end of the resistor 130b is electrically connected to the second electrode 120b through a conductive via 145b.

By providing the gate resistive element 100 shown in FIG. 12 in the semiconductor device 10, the area of the first electrode 110 of the gate resistive element 100 can be increased as compared to the case where gate resistive elements are provided separately. Accordingly, the area for bonding increases when the first electrode 110 is solder-bonded to the placement surface 56 of the circuit board 50, thereby increasing the bonding strength. Note that although FIG. 12 shows a case where elements of the two gate resistive elements 100a, 100b are provided in the one gate resistive element 100, elements of three gate resistive elements or more may be provided.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

REFERENCE SIGNS LIST

10: semiconductor device; 20: transistor element; 21: gate pad; 30: diode element; 50: circuit board; 51: circuit layer; 52: circuit layer; 53: circuit layer; 54: circuit layer; 56: placement surface; 57: layer; 58: depression; 59: depression; 62: wire; 64: wire; 66: wire; 100: gate resistive element; 110: first electrode; 112: straight line portion; 114: corner; 120: second electrode; 130: resistor; 132: first resistor; 133: second resistor; 134: third resistor; 135: fourth resistor; 136: fifth resistor; 144: conductive via; 145: conductive via; 146: connecting portion; 147: via; 148: via; 150: ceramic insulator

What is claimed is:

1. A semiconductor device comprising:
a transistor element;
a diode element formed in a SiC substrate, the diode element including a positive terminal electrically connected to an emitter of the transistor element and a negative terminal electrically connected to a collector of the transistor element;
a ceramic resistive element having:
a first planar electrode situated on a surface of the ceramic resistive element,
a second planar electrode arranged on an opposite surface of the ceramic resistive element and substantially parallel to the first planar electrode, and
a resistive element formed of a ceramic-containing material provided between the first planar electrode and the second planar electrode, where the resistive element
is electrically connected between the first planar electrode and the second planar electrode, and
the second planar electrode is electrically connected to a gate of the transistor element through a wire, and
has a resistor temperature coefficient which is within a range of $\pm 150 \times 10^{-6}$/K, and includes a plurality of resistors, and where
the transistor element, the diode element formed in the SiC substrate and the first planar electrode of the ceramic resistive element are placed on a placement surface of a circuit board.

2. The semiconductor device according to claim 1, wherein, between the first planar electrode and the second planar electrode, a ceramic insulator is provided around the resistive element.

3. The semiconductor device according to claim 2, wherein a thickness of the ceramic insulator is greater between the plurality of resistors and the first planar electrode than between the plurality of resistors element and the second planar electrode.

4. The semiconductor device according to claim 1, wherein a thickness of the second planar electrode is greater than a thickness of the first planar electrode.

5. The semiconductor device according to claim 1, wherein an outline of the first planar electrode as seen from a perpendicular direction to a bottom surface of the first planar electrode includes a rounded corner.

6. The semiconductor device according to claim 1, wherein
a depression is provided in the placement surface of the circuit board, and
the ceramic resistive element is placed in the depression.

7. The semiconductor device according to claim 1, wherein
the plurality of resistors are electrically connected to each other in series.

8. The semiconductor device according to claim 7, wherein the plurality of resistors are arranged along a surface parallel with the first planar electrode.

9. The semiconductor device according to claim 7, wherein
the plurality of resistors have a ceramic insulator being superimposed therebetween them, and
electrical connection is established between the plurality of resistors through vias provided in the ceramic insulator.

10. The semiconductor device according to claim 1, wherein
the second planar electrode includes a plurality of second planar electrodes that are separated from each other so as to be electrically connected to gates of individual transistors among the plurality of transistors,
the plurality of resistors are electrically connected to the first planar electrode, and
the plurality of resistors are electrically connected to the plurality of second planar electrodes, respectively.

11. A semiconductor device comprising:
a transistor element;
a diode element formed in a SiC substrate, the diode element including a positive terminal electrically connected to an emitter of the transistor element and a negative terminal electrically connected to a collector of the transistor element; and a gate resistive element comprising
- a first planar electrode on a surface of the gate resistive element;
- a second planar electrode on an opposite surface of the gate resistive element, substantially parallel to the first planar electrode; and
- a plurality of resistors are formed of a ceramic containing material provided between the first planar electrode and the second planar electrode; wherein
  - one of the plurality of resistors is electrically connected to a gate of the transistor element, and
  - the plurality of resistors are electrically connected between the first planar electrode and the second planar electrode.

12. The semiconductor device of claim 11 wherein one of the plurality of resistors has a resistor temperature coefficient which is within a range of $\pm 150 \times 10^{-6}/K$.

13. The semiconductor device of claim 11 wherein a thickness of the first planar electrode is greater than a thickness of the second planar electrode.

14. The semiconductor device of claim 11 wherein one of the plurality of resistors is closer to the first planar electrode.

* * * * *